United States Patent
Washeleski et al.

(10) Patent No.: US 6,499,359 B1
(45) Date of Patent: Dec. 31, 2002

(54) COMPRESSIBLE CAPACITANCE SENSOR FOR DETERMINING THE PRESENCE OF AN OBJECT

(75) Inventors: John M. Washeleski, Cadillac, MI (US); Randall L. Perrin, Cadillac, MI (US)

(73) Assignee: Nartron Corporation, Reed City, MI (US)

(*) Notice: Subject to any disclaimer, the term of this patent is extended or adjusted under 35 U.S.C. 154(b) by 0 days.

(21) Appl. No.: 09/901,883

(22) Filed: Jul. 9, 2001

(51) Int. Cl.[7] ................................................ G01L 1/04
(52) U.S. Cl. ................................................ 73/862.473
(58) Field of Search .................. 73/780, 818, 862.337, 73/862.451, 862.471, 862.637, 862.473

(56) References Cited

U.S. PATENT DOCUMENTS

| | | |
|---|---|---|
| 3,710,209 A | 1/1973 | Webb et al. |
| 3,951,250 A | 4/1976 | Pointon et al. |
| 3,964,594 A | 6/1976 | Gabbrielli et al. |
| 3,965,399 A | 6/1976 | Walker et al. |
| 4,132,487 A | 1/1979 | Fisher |
| 4,266,263 A | 5/1981 | Haberl et al. |
| 4,369,663 A * | 1/1983 | Venturello et al. .......... 324/660 |
| 4,370,697 A | 1/1983 | Haberl et al. |
| 4,373,122 A | 2/1983 | Frame |
| 4,373,124 A | 2/1983 | Frame |
| 4,521,685 A | 6/1985 | Rebman |
| 4,526,043 A | 7/1985 | Boie et al. |
| 4,584,625 A | 4/1986 | Kellogg |
| 4,731,548 A | 3/1988 | Ingraham |
| 4,758,735 A | 7/1988 | Ingraham |
| 4,831,279 A | 5/1989 | Ingraham |
| 4,839,512 A * | 6/1989 | Speck ..................... 250/231.1 |
| 5,036,275 A | 7/1991 | Munch et al. |
| 5,087,825 A | 2/1992 | Ingraham |
| 5,131,401 A * | 7/1992 | Westenskow et al. ........ 600/554 |
| 5,159,316 A * | 10/1992 | Lazzara ...................... 307/119 |
| 5,210,490 A | 5/1993 | Munch et al. |
| 5,216,364 A | 6/1993 | Ko et al. |
| 5,217,280 A | 6/1993 | Nykerk et al. |
| 5,334,876 A | 8/1994 | Washeleski et al. |
| 5,447,076 A | 9/1995 | Ziegler |
| 5,642,043 A | 6/1997 | Ko et al. |
| 5,775,332 A | 7/1998 | Goldman |
| 5,789,915 A | 8/1998 | Ingraham |
| 5,796,183 A | 8/1998 | Hourmand |
| 5,851,026 A | 12/1998 | Schoos et al. |
| 5,952,801 A | 9/1999 | Boisvert et al. |
| 6,006,386 A * | 12/1999 | Mohaupt .................. 73/862.68 |
| 6,038,930 A | 3/2000 | Lehnen et al. |
| 6,064,165 A | 5/2000 | Boisvert et al. |
| 6,142,513 A | 11/2000 | Schoos et al. |

* cited by examiner

*Primary Examiner*—Max Noori
(74) *Attorney, Agent, or Firm*—Brooks & Kushman, P.C.

(57) ABSTRACT

A compressible variable capacitance sensor for determining the presence, size, position, and type of an object such as a human body part includes two flexible conductor elements separated by a non-conductive compressible element. The capacitance of the capacitance sensor changes as a function of force applied by an object on the capacitance sensor. A controller senses the capacitance of the capacitance sensor and controls a device accordingly. The device may be a movable closed opening such as a window in which the controller controls the window as a function of the monitored capacitance to prevent pinching of the object. The device may also be a seat in which the controller determines the characteristics of the seat occupant based on the monitored capacitance.

26 Claims, 3 Drawing Sheets

COMPRESSIBLE CAPACITANCE SENSOR FOR DETERMINING THE PRESENCE OF AN OBJECT

TECHNICAL FIELD

The present invention is generally related to capacitance sensors for determining the presence of an object and, more particularly, to a capacitance sensor having a non-conductive compressible element between flexible conductors for determining the presence of an object.

BACKGROUND ART

Various types of sensors are used to determine the presence, size, and/or position of an object such as a human body part. For example, in the automotive industry, sensors are used for pinch sensing at electrically operated doors, windows, hatches, decks, hoods, lids, and the like and for seat occupant sensing.

A pinch sensor detects the presence of an object such as a finger, hand, and the like being pinched by a closed opening such as a window. In operation, the pinch sensor generates a pinch signal in response to an object being pinched by the window. In response to the pinch signal, a controller controls the window to reverse direction to prevent further pinching and allow the object to be removed from the opening. A seat occupant sensor generates an occupant signal indicative of characteristics of an object such as a human occupant sitting on a seat. A controller uses the occupant signal to control various systems such as an air bag system as a function of the occupant's characteristics (adult or child) sitting on the seat.

Motor current sensors, infrared beam sensors, and continuous switch sensors have been used for pinch sensing. A problem with motor current sensors and infrared beam sensors is that they can be fooled into causing an electrically closed opening to remain open due to changing mechanical and environmental conditions. A problem with continuous switch sensors is that they do not provide any lag time between switch activation and a pinch of an object. Thus, what is needed is a pinch sensor that is reliable in view of changing mechanical and environmental conditions and that provides a lag time to prevent a pinch of the object.

Fiber-optic sensors, ultrasonic sensors, electromagnetic sensors, piezometric sensors, and switch matrix sensors have been used for seat occupant sensing. A problem with these types of seat occupant sensors is that they are complex and costly. Thus, what is needed is a seat occupant sensor that is simple and cost efficient.

DISCLOSURE OF INVENTION

Accordingly, it is an object of the present invention to provide a capacitance sensor having a non-conductive compressible element between flexible conductors for determining the presence of an object.

It is another object of the present invention to provide a pinch capacitance sensor having a non-conductive compressible element between flexible conductors for determining the presence of an object about to be pinched by a closed opening.

It is a further object of the present invention to provide a seat occupant capacitance sensor having a non-conductive compressible element between flexible conductors for determining seat occupant characteristics such as presence, size, position, and type of the seat occupant.

It is still another object of the present invention to provide a seat occupant capacitance sensor having a non-conductive compressible element between flexible conductors for determining whether a seat object is an animate or inanimate object.

In carrying out the above objects and other objects, the present invention provides a sensor for determining the presence of an object. The sensor includes first and second flexible conductor elements separated by a separation distance and having a capacitance dependent on the separation distance. A non-conductive compressible element is interposed between the first and second flexible conductor elements. The non-conductive compressible element compresses in response to an object applying a force to at least one of the first and second flexible conductor elements such that the separation distance between the first and second flexible conductor elements decreases. The capacitance of the first and second flexible conductor elements changes in response to the separation distance between the first and second flexible conductor elements decreasing.

The sensor may include a controller for monitoring the capacitance of the first and second flexible conductor elements. The controller determines the presence of an object applying a force to at least one of the first and second flexible conductor elements in response to the capacitance of the first and second flexible conductor elements changing.

The controller, which may include a microprocessor, may be operable for generating an offset signal to bias the capacitance between the first and second flexible conductor elements. The controller may be operable for executing filtering software to monitor the capacitance between the first and second flexible conductor elements. The controller may be operable for executing an adaptive threshold detection algorithm to monitor the capacitance between the first and second flexible conductor elements.

The first flexible conductor element may be a center core with the second flexible conductor element coaxially surrounding the non-conductive compressible element and the first flexible conductor element. The second flexible conductor element is preferably electrically grounded. An elastomeric overcoat may coaxially surround the second flexible conductor element.

The sensor may further include a non-conductive compressible core. In this case, the first flexible conductor element coaxially surrounds the non-conductive compressible core, the non-conductive compressible element coaxially surrounds the first flexible conductor element, and the second flexible conductor element coaxially surrounds the non-conductive compressible element.

The sensor may further include a third flexible conductor element. In this case, the second and third flexible conductor elements are electrically grounded and surround at least a portion of the first flexible conductor element. The non-conductive compressible element is interposed between the first, second, and third flexible conductor elements such that the first and second flexible conductor elements are separated by a first separation distance and have a first capacitance dependent on the first separation distance, and the first and third flexible conductor elements are separated by a second separation distance and have a second capacitance dependent on the second separation distance. The first and second capacitances change in response to the first and second separation distances decreasing when an object applies a force to at least one of the second and third flexible conductor elements.

The non-conductive compressible element may include a cell foam, at least one of the first and second flexible conductors elements may include a braided electrically conductive wire or an electrically conductive plate.

Further, in carrying out the above objects and other objects, the present invention provides a pinch sensor system for determining the presence of an object within an opening defined by a closed opening device. The pinch sensor system includes a compressible capacitance pinch sensor fixedly positioned adjacent a closed opening device. The compressible capacitance pinch sensor has first and second flexible conductor elements separated by a separation distance. The first and second flexible conductor elements have a capacitance dependent on the separation distance. The compressible capacitance pinch sensor further has a non-conductive compressible element interposed between the first and second flexible conductor elements. The non-conductive compressible element compresses in response to an object within the opening touching the compressible capacitance pinch sensor such that the separation distance between the first and second flexible conductor elements decreases. The capacitance of the first and second flexible conductor elements changes in response to the separation distance between the first and second flexible conductor elements decreasing.

The pinch sensor system further includes a controller for monitoring the capacitance of the first and second flexible conductor elements. The controller determines the presence of the object within the opening in response to the capacitance of the first and second flexible conductor elements changing. The controller controls the closed opening device as a function of the change in capacitance.

Also, in carrying out the above objects and other objects, the present invention provides a seat occupant sensor system. The seat occupant sensor system includes at least one seat occupant sensor disposed within a seat. The at least one seat occupant sensor includes first, second, and third flexible conductor plates. The first flexible conductor plate is interposed between the second and third flexible conductor plates such that the first and third flexible conductor plates are separated by a separation distance. The second and third flexible conductor plates are electrically grounded and the first, second, and third flexible conductor plates have a capacitance dependent on the separation distance. The at least one seat occupant sensor further includes a first non-conductive compressible element interposed between the first and second flexible conductor plates and a second non-conductive compressible element interposed between the first and third flexible conductor plates. The first and second non-conductive compressible elements compress in response to a seat occupant applying force to the at least one seat occupant sensor such that the separation distance between the second and third flexible conductor plates decreases. The capacitance changes in response to the separation distance decreasing.

The seat occupant sensor system further includes a controller for determining characteristics of the seat occupant as a function of the capacitance of the at least one seat occupant sensor.

The at least one seat occupant sensor may include a seat back sensor disposed within a seat back of the seat. The controller determines whether the seat occupant is sitting back on the seat back as a function of the capacitance of the seat back sensor.

The at least one seat occupant sensor may include a seat bottom front sensor disposed within a front portion of a seat bottom of the seat. The controller determines whether the seat occupant is sitting short or forward on the seat bottom as a function of the capacitance of the seat bottom front sensor.

The at least one seat occupant sensor may include a seat bottom left sensor disposed within a left portion of a seat bottom of the seat and a seat bottom right sensor disposed within a right portion of the seat bottom. The controller determines whether the seat occupant is sitting left or right on the seat bottom as a function of the capacitances of the seat bottom left and right sensors.

The at least one seat occupant sensor may include at least one seat bottom sensor disposed within a seat bottom of the seat. The controller determines the weight of the seat occupant as a function of the capacitance of the at least one seat bottom sensor.

The controller may be operable to reverse the polarity between the first, second, and third flexible conductor plates such that the first conductor plate is electrically grounded. The controller monitors the capacitance of the at least one seat occupant sensor after reversing the polarity to determine whether the seat occupant is an animate or inanimate object.

The above objects and other objects, features, and advantages of the present invention are readily apparent from the following detailed description of the best mode for carrying out the present invention when taken in connection with the accompanying drawings.

BEST MODE FOR CARRYING OUT THE INVENTION

Figure 1:
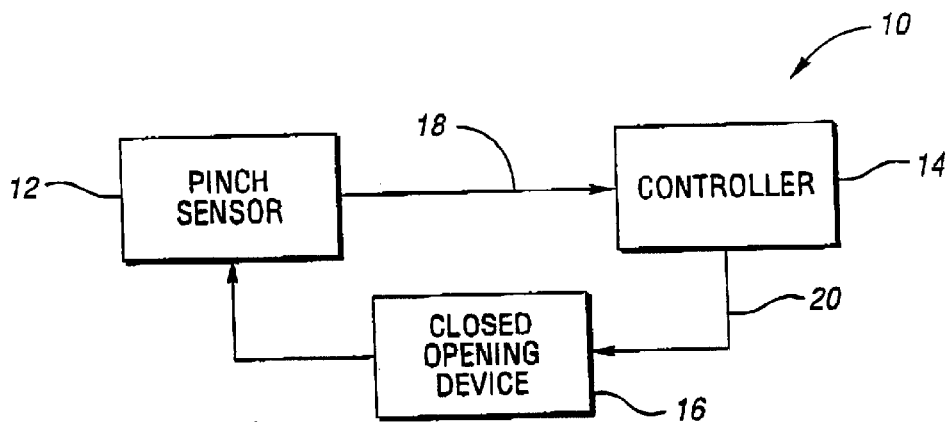
FIG. 1 illustrates a pinch sensor system in accordance with a first embodiment of the present invention.

Referring now to FIG. 1, a pinch sensor system 10 in accordance with a first embodiment of the present invention is shown. Pinch sensor system 10 includes a capacitance pinch sensor 12 and a controller 14. Pinch sensor 12 monitors a closed opening device 16 such as an electrically operated window or door to determine whether an object such as a human body part is about to be pinched by the device or is being pinched by the device. In response to an object starting to be pinched by device 16 while the device is closing pinch sensor 12 generates a pinch sensor signal 18. Pinch sensor 12 then provides pinch sensor signal 18 to controller 14. In response to receiving pinch sensor signal 18, controller 14 transmits an open device control signal 20 to device 16. In response to receiving open device control signal 20, device 16 terminates closing and reverses its direction to open and allow the object to be removed from the closed opening thereby preventing any pinching of the object.

Figure 2:
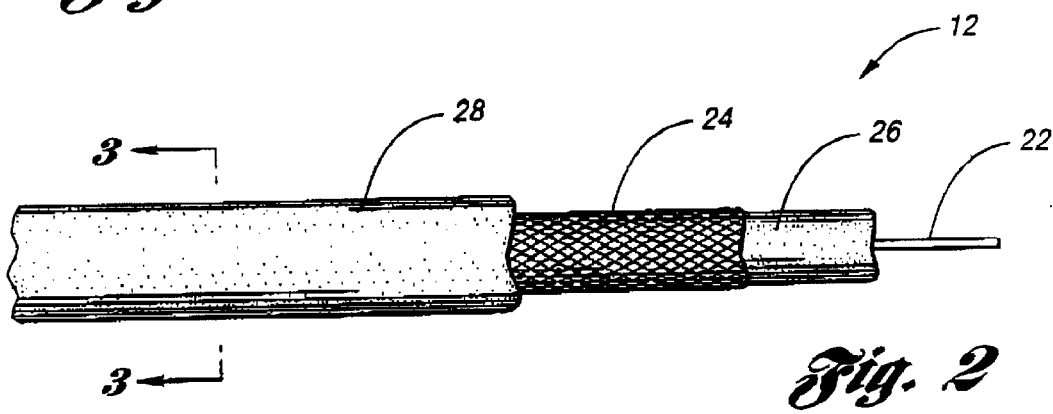
FIG. 2 illustrates a first embodiment of the pinch sensor of the pinch sensor system shown in FIG. 1.
Figure 3:
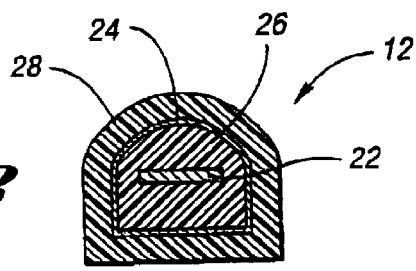
FIG. 3 illustrates a cross-sectional view of the pinch sensor shown in FIG. 2 taken along the line 3–3.

Referring now to FIGS. 2 and 3, a first embodiment of pinch sensor 12 is shown. Pinch sensor 12 includes a flexible center conductive element or core 22 coaxially surrounded by a non-conductive compressible element or layer 26 that is in turn coaxially surrounded by a flexible outer conductive element or layer 24. Non-conductive compressible layer 26 separates conductive core 22 and conductive layer 24. Conductive layer 24 is electrically grounded and fully shields conductive core 22. An elastomeric overcoat 28 covers conductive layer 24.

Conductive core 22 and conductive layer 24 are made from conductive materials such as aluminum, copper, and the like. Conductive core 22 and conductive layer 24 may each be a braided mesh which gives the conductive core and the conductive layer their flexibility. Non-conductive compressible layer 26 may be an EPDM closed cell foam having a high dielectric constant and a low compressible force. The dielectric constant and/or compressibility of non-conductive layer 26 may be changed by using different types of materials. Elastomeric overcoat 28 may be made from elastomer, rubber, vinyl, and the like. Elastomeric overcoat 28 may be flexible and/or compressible and may incorporate sealing elements.

Figures 4A, 4B:
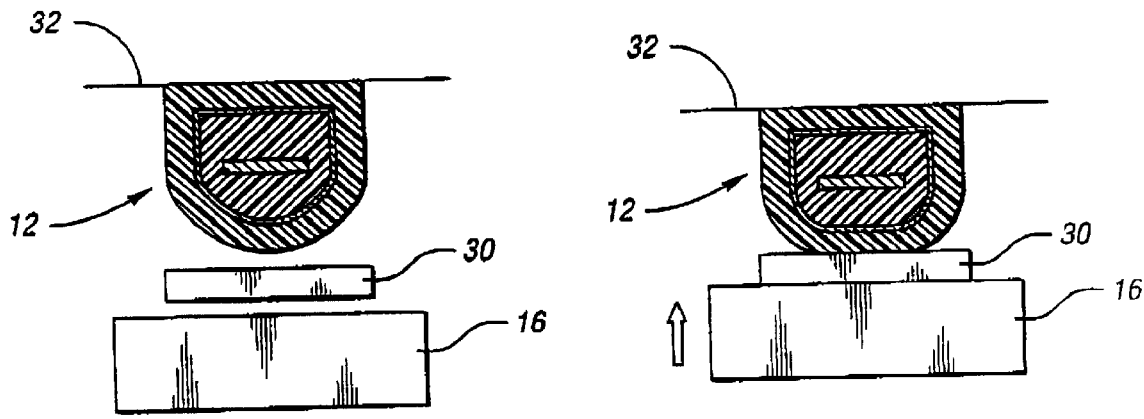
FIGS. 4A and 4B illustrate the operation of the pinch sensor of the pinch sensor system shown in FIG. 1.

Referring now to FIGS. 4A and 4B, with continual reference to FIG. 1, the operation of pinch sensor 12 and pinch sensor system 10 will now be described. In operation, pinch sensor 12 is mounted to a fixed assembly such as an automobile window body panel 32. In FIG. 4A, an object 30 such as a human body part is placed in an opening between pinch sensor 12 and closed opening device 16 such as an automobile window. As shown, the opening between pinch sensor 12 and window 16 is sufficiently large enough such that object 30 can move freely in the opening without being pinched by the window. In FIG. 4B, window 16 starts to close in the direction of the arrow towards window body panel 32 and the opening becomes smaller such that object 30 is adjacent to pinch sensor 12 and window 16 and touches the pinch sensor. In response to object 30 touching pinch sensor 12, the pinch sensor compresses such that the distance between conductive core 22 and conductive layer 24 becomes smaller. As a result of this distance becoming smaller, the capacitance of pinch sensor 12 changes.

Pinch sensor 12 then generates a pinch sensor signal 18 indicative of this change in capacitance to controller 14. Controller 14 processes pinch sensor signal 18 to determine that the capacitance of pinch sensor 12 has changed as a result of object 30 touching the pinch sensor and is about to be pinched by window 16. Controller 14 then transmits an open device control signal 20 to device 16 to reverse the direction of the device away from window body panel 32 thereby increasing the opening and allowing the object to be removed from the opening without any pinching of the object.

In a preferred embodiment, controller 14 is an electronic controller such as a microprocessor based controller that includes a digital to analog (DAC) converter. The DAC converter allows for the subtraction (or an addition) of an offset voltage to allow for greater amplification of pinch sensor signal 18. Alternative embodiments could include analog waveform generation, such as a triangle wave, to accomplish the determination of the magnitude of the offset voltage for subsequent subtraction (or addition) thereof. The microprocessor of controller 14 may execute software for filtering and may use algorithms for adaptive threshold detection enabling determination of compression of pinch sensor 12. In further alternative embodiments, the microprocessor of controller 14 may be substituted with discrete electronic or a custom application specific integrated circuit that may include microprocessor core analog and digital circuitry.

Figure 5:
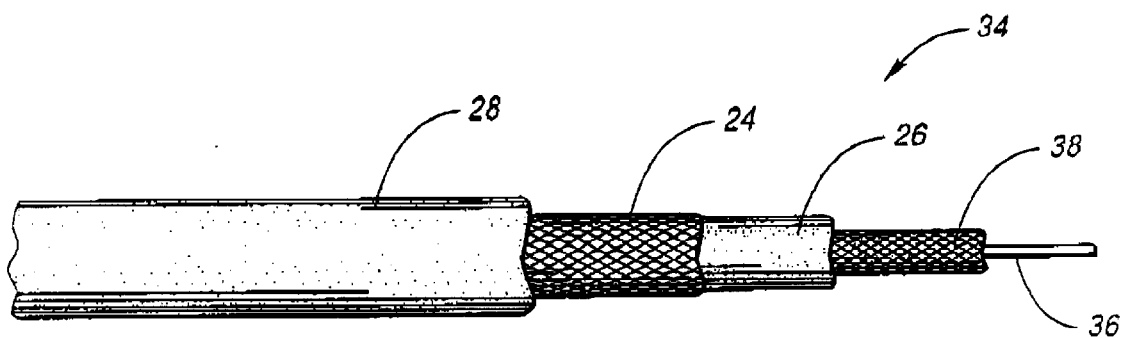
FIG. 5 illustrates a second embodiment of the pinch sensor of the pinch sensor system shown in FIG. 1.

Referring now to FIG. 5, a pinch sensor 34 in accordance with a second embodiment of the pinch sensor is shown. Pinch sensor 34 is similar to pinch sensor 12 but in place of conductive core 22, pinch sensor 34 includes a non-conductive compressible core 36 coaxially surrounded by a flexible conductor element or layer 38. Non-conductive compressible core and layer 36 and 26 may be made from the same closed cell foam. Like conductive layer 24, conductive layer 38 may also be a braided wire mesh made from a conductive material.

Figure 6:
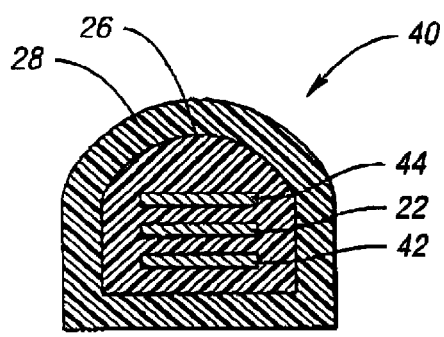
FIG. 6 illustrates a cross-sectional view of a third embodiment of the pinch sensor of the pinch sensor system shown in FIG. 1.

Referring now to FIG. 6, a cross-sectional view of a pinch sensor 40 in accordance with a third embodiment of the pinch sensor is shown. Pinch sensor 40 is similar to pinch sensor 12 but in place of the all encompassing conductive layer 24, pinch sensor 40 includes first and second flexible conductor shielding plates 42 and 44. Conductive core 22 is interposed between first and second conductor shielding plates 42 and 44. First and second conductor shielding plates 42 and 44 are electrically interconnected (not specifically shown).

Figure 7:
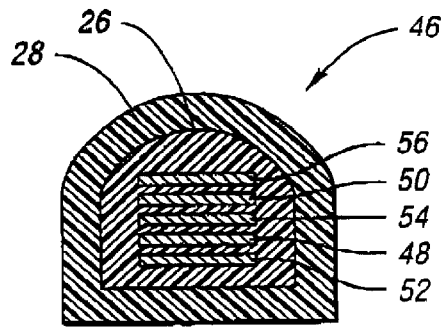
FIG. 7 illustrates a cross-sectional view of a fourth embodiment of the pinch sensor of the pinch sensor system shown in FIG. 1.

Referring now to FIG. 7, a cross-sectional view of a pinch sensor 46 in accordance with a fourth embodiment of the pinch sensor is shown. Pinch sensor 46 includes two flexible conductor core plates 48 and 50 and three flexible conductor shielding plates 52, 54, and 56. Conductor core plates 48 and 50 are alternatively disposed between conductor shielding plates 52, 54, and 56. Both pinch sensor 46 and pinch sensor 40 have the same width but pinch sensor 46 has a higher height than pinch sensor 40 as a result of the additional plates. As a result, pinch sensor 46 has a higher capacitance than pinch sensor 40.

Figure 8:
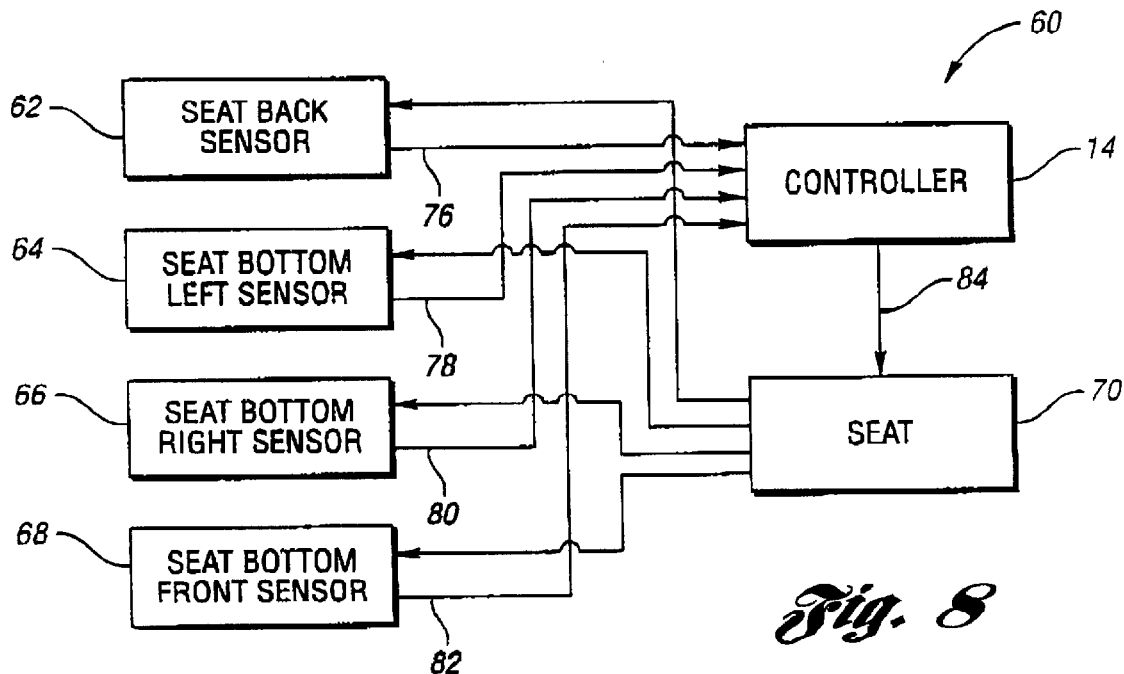
FIG. 8 illustrates a seat occupant sensor system in accordance with a second embodiment of the present invention.

Referring now to FIG. 8, a seat occupant sensor system 60 in accordance with a second embodiment of the present invention is shown. Seat occupant sensor system 60 includes four seat capacitance sensors 62, 64, 66, and 68, and a controller 14. Seat sensors include a seat back sensor 62, a seat bottom left sensor 64, a seat bottom right sensor 66, and a seat bottom front sensor 68. Seat sensors 62, 64, 66, and 68 monitor a seat 70 to determine the characteristics such as presence, size, position, and type of an occupant of the seat.

Figure 9:
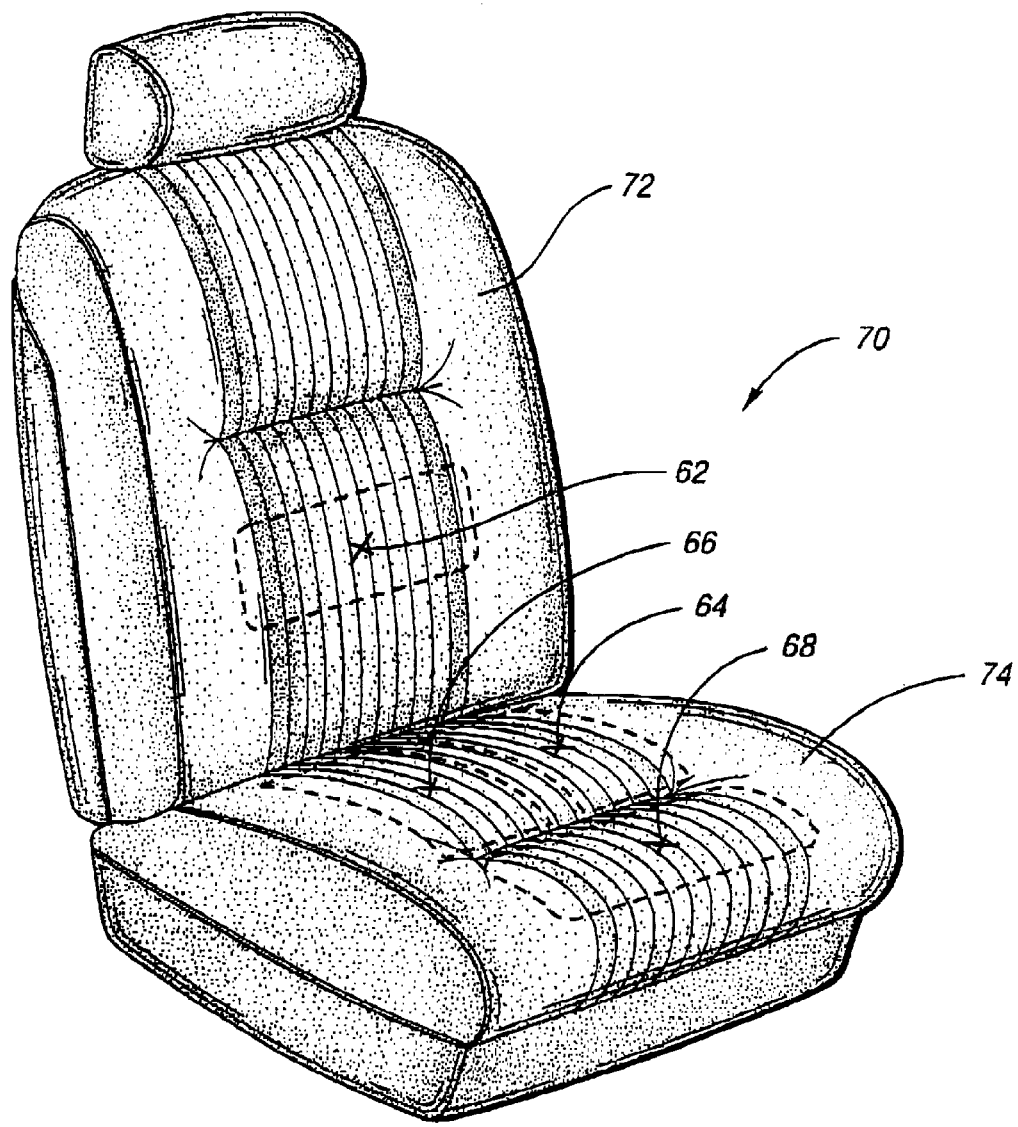
FIG. 9 illustrates the position of the seat sensors of the seat occupant system shown in FIG. 8 within a seat.

FIG. 9 illustrates the placement seat sensors 62, 64, 66, and 68 within seat 70. As shown, seat back sensor 62 is placed within a seat back 72 of seat 70. Seat bottom left and right sensors 64 and 66 are placed within the main sitting portion of a seat bottom 74 of seat 70. Seat bottom front sensor 68 is placed within the front sitting portion of seat bottom 74.

Each seat sensor 62, 64, 66, and 68 monitors seat 70 and generates a respective seat sensor signal 76, 78, 80, and 82. Controller 14 receives seat sensor signals 76, 78, 80, and 82 and processes them to determine the characteristics of an occupant of seat 70. Controller 14 processes seat sensor signal 76 from seat back sensor 62 to determine if the occupant is sitting back on seat back 72. Controller 14 processes seat sensor signals 78, 80, and 82 from seat bottom left sensor 64, seat bottom right sensor 66, and seat bottom front sensor 68 to determine the weight of the occupant of seat 70. Controller 14 processes seat sensor signals 78 and 80 from seat bottom left and right sensors 64 and 66 to determine whether the seat occupant is sitting left or right in seat 70. Controller 14 processes seat sensor signal 82 from seat bottom front sensor 68 to determine whether the occupant of seat 70 is sitting short of forward in the seat. Controller 14 also processes seat sensor signal 76, 78, 80, and 82 to determine the size of the occupant of seat 70 as a short occupant puts relatively more weight on seat bottom front sensor 68 than a taller occupant.

Controller 14 generates a seat control signal 84 as a function of the characteristics of the seat occupant as a result of processing seat sensor signals 62, 64, 66, and 68. Controller 14 then provides seat control signal 84 to seat 70 to control various systems associated with the seat. For instance, controller 14 may generate a seat control signal 84 causing an air bag system to deploy with a minimal force if the controller determines that the seat occupant is a child as a result of processing seat sensor signals 62, 64, 66, and 68.

Figure 10:
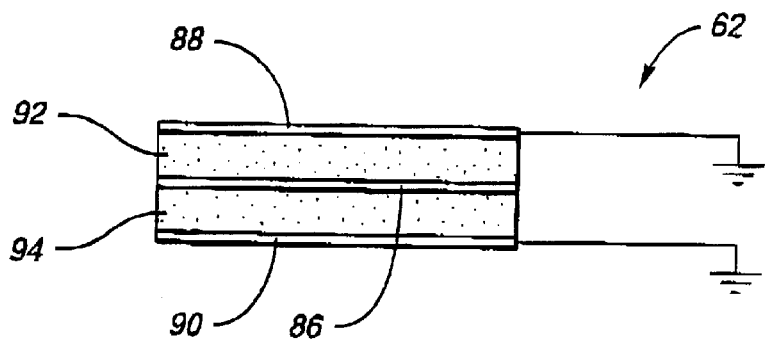
FIG. 10 illustrates a seat occupant sensor of the seat occupant sensor system shown in FIG. 8.

Referring now to FIG. 10, a seat occupant sensor such as seat back sensor 62 of seat occupant system 60 is shown in greater detail. Seat occupant sensor 62 includes a flexible conductor center plate 86 and two flexible conductor shielding plates 88 and 90. A non-conductive compressible element or layer 92 separates conductor core plate 86 and shielding plate 88. A non-conductive compressible element or layer 94 separates conductor center plate 86 and shielding plate 90. Plates 88 and 90 are electrically interconnected by fusion or electrically conductive tape and are both electrically grounded. Non-conductive compressible layers 92 and 94 may be an EPDM closed cell foam like non-conductive compressible layer 26. Each of seat occupant sensors 62, 64, 66, and 68 is able to be configured into different shapes for placement into seat 70 as conductor plates 86, 88, and 90 are flexible and non-conductive layers 92 and 94 are compressible.

Each of plates 86, 88, and 90 may be made from a lamination process although extrusion techniques may be used. For instance, plates 86, 88, and 90 may be super flex conductive wire weaved together or a mylar film with etched conductive devices. During the lamination process, pressure sensitive adhesive is applied to the mating surfaces of non-conductive compressible layers 92 and 94. A release tape is applied to one edge of one of non-conductive compressible layers 92 or 94 to provide access to conductor core plate 86 for attachment of an electrical wire. The release tape is removed after the wire is attached to conductor core plate 86 and then the edge is bonded.

Each of seat occupant sensors 62, 64, 66, and 68 operate like pinch sensor 12. That is, when a force is applied to a seat occupant sensor, the distance between shielding plates 88 and 90 with respect to center plate 86 changes as a function of the force applied to the seat occupant sensor. The capacitance of the seat occupant sensor likewise changes as a result of the distance between shielding plates 88 and 90 with respect to center plate 86 changing. Seat occupant sensor then provides a respective seat occupant sensor signal to controller 14 indicative of the change in capacitance as a result of the force applied to the seat occupant sensor. As described above, controller 14 processes the respective seat occupant sensor signals to determine the characteristics of the seat occupant such as weight, position, size, and the like.

In addition to determining the above noted characteristics of the seat occupant, seat occupant system 60 may determine whether the occupant is a biological occupant such as a human or an animal occupant or an inanimate object. To do this, controller 14 reverses the polarity between center plate 86 and shielding plates 88 and 90 in order to monitor the capacitance characteristics of the occupant. A high monitored capacitance of the occupant is indicative of a high conductivity object, and a low monitored capacitance is indicative of a low conductivity object or an insulative object. A human occupant will result in a capacitance reading that is between highly conductive objects, such as metals, and insulative objects.

Thus it is apparent that there has been provided, in accordance with the present invention, a capacitance sensor having a non-conductive compressible element between flexible conductors for determining the presence of an object that fully satisfies the objects, aims, and advantages set forth above. While the present invention has been described in conjunction with specific embodiments thereof, it is evident that many alternatives, modifications, and variations will be apparent to those skilled in the art in light of the foregoing description. Accordingly, it is intended to embrace all such alternatives.

What is claimed is:

1. A pinch sensor for preventing an object within an opening defined by a closed opening device from being pinched by the closed opening device, the sensor comprising:

first and second flexible conductor elements separated by a separation distance and having a capacitance dependent on the separation distance, the first and second flexible conductor elements fixedly positioned adjacent to an opening defined by a closed opening device; and a non-conductive compressible element interposed between the first and second flexible conductor elements, wherein the non-conductive compressible element compresses in response to an object within the opening applying a force to at least one of the first and second flexible conductor elements such that the separation distance between the first and second flexible conductor elements decreases, wherein the capacitance of the first and second flexible conductor elements changes in response to the separation distance between the first and second flexible conductor elements decreasing.

2. The sensor of claim 1 further comprising:

a controller for monitoring the capacitance of the first and second flexible conductor elements, wherein the controller controls the closed opening device to prevent the closed opening device from pinching the object in response to the object applying the force to at least one of the first and second flexible conductor elements.

3. The sensor of claim 1 wherein:

the first flexible conductor element is a center core and the second flexible conductor element coaxially surrounds the non-conductive compressible element and the first flexible conductor element.

4. The sensor of claim 3 wherein:

the second flexible conductor element is electrically grounded.

5. The sensor of claim 3 further comprising:

an elastomeric overcoat coaxially surrounding the second flexible conductor element.

6. The sensor of claim 1 further comprising:

a non-conductive compressible core, wherein the first flexible conductor element coaxially surrounds the non-conductive compressible core, the non-conductive compressible element coaxially surrounds the first flexible conductor element, and the second flexible conductor element coaxially surrounds the non-conductive compressible element.

7. The sensor of claim 1 further comprising:

a third flexible conductor element fixedly positioned adjacent to the opening defined by the closed opening device, wherein the second and third flexible conductor elements are electrically grounded and surround at least a portion of the first flexible conductor element and the non-conductive compressible element is interposed between the first, second, and third flexible conductor elements such that the first and second flexible conductor elements are separated by a first separation distance and have a first capacitance dependent on the first separation distance, and the first and third flexible conductor elements are separated by a second separation distance and have a second capacitance dependent on the second separation distance, wherein the first and second capacitances change in response to the first and second separation distances decreasing when the object applies a force to at least one of the second and third flexible conductor elements.

8. The sensor of claim 1 wherein:

the non-conductive compressible element includes a cell foam.

9. The sensor of claim 1 wherein:

at least one of the first and second flexible conductors elements includes a braided electrically conductive wire.

10. The sensor of claim 1 wherein:

at least one of the first and second flexible conductor elements includes a laminated electrically conductive plate.

11. The sensor of claim 2 wherein:

the controller is operable for generating an offset signal to bias the capacitance between the first and second flexible conductor elements.

12. The sensor of claim 2 wherein:

the controller includes a microprocessor.

13. The sensor of claim 2 wherein:

the controller is operable for executing filtering software to monitor the capacitance between the first and second flexible conductor elements.

14. The sensor of claim 2 wherein:

the controller is operable for executing an adaptive threshold detection algorithm to monitor the capacitance between the first and second flexible conductor elements.

15. A pinch sensor system for preventing an object within an opening defined by a closed opening device from being pinched by the closed opening device, the pinch sensor system comprising:

a compressible capacitance pinch sensor fixedly positioned adjacent an opening defined by a closed opening device, the compressible capacitance pinch sensor having first and second flexible conductor elements separated by a separation distance, the first and second flexible conductor elements having a capacitance dependent on the separation distance, the compressible capacitance pinch sensor further having a non-conductive compressible element interposed between the first and second flexible conductor elements, wherein the non-conductive compressible element compresses in response to an object within the opening touching the compressible capacitance pinch sensor such that the separation distance between the first and second flexible conductor elements decreases, wherein the capacitance of the first and second flexible conductor elements changes in response to the separation distance between the first and second flexible conductor elements decreasing; and a controller for monitoring the capacitance of the first and second flexible conductor elements, wherein the controller controls the closed opening device to prevent the closed opening device from pinching the object in response to the object touching the compressible capacitance pinch sensor.

16. The pinch sensor system of claim 15 wherein:

the closed opening device is an electrically operated window.

17. The pinch sensor system of claim 15 wherein:

the closed opening device is an electrically operated door.

18. The pinch sensor system of claim 15 wherein:

the first flexible conductor element is a center core and the second flexible conductor element is electrically grounded and coaxially surrounds the non-conductive compressible element and the first flexible conductor element.

19. The pinch sensor system of claim 18 further comprising:

an elastomeric overcoat coaxially surrounding the second flexible conductor element.

20. The pinch sensor system of claim 15 wherein:

the non-conductive compressible element includes a cell foam.

21. A seat occupant sensor system for determining characteristics of a seat occupant, the seat occupant sensor system comprising:

at least one seat occupant sensor disposed within a seat, the at least one seat occupant sensor including first, second, and third flexible conductor plates, wherein the first flexible conductor plate is interposed between the second and third flexible conductor plates such that the first and third flexible conductor plates are separated by a separation distance, wherein the second and third flexible conductor plates are electrically grounded and the first, second, and third flexible conductor plates have a capacitance dependent on the separation distance, the at least one seat occupant sensor further including a first non-conductive compressible element interposed between the first and second flexible conductor plates and a second non-conductive compressible element interposed between the first and third flexible conductor plates, wherein the first and second non-conductive compressible elements compress in response to a seat occupant applying force to the at least one seat occupant sensor such that the separation distance between the second and third flexible conductor plates decreases, wherein the capacitance changes in response to the separation distance decreasing; and a controller for determining characteristics of the seat occupant as a function of the capacitance of the at least one seat occupant sensor.

22. The seat occupant sensor system of claim 21 wherein:

the at least one seat occupant sensor includes a seat back sensor disposed within a seat back of the seat, wherein the controller determines whether the seat occupant is sitting back on the seat back as a function of the capacitance of the seat back sensor.

23. The seat occupant sensor system of claim 21 wherein:

the at least one seat occupant sensor includes a seat bottom front sensor disposed within a front portion of a seat bottom of the seat, wherein the controller determines whether the seat occupant is sitting short or forward on the seat bottom as a function of the capacitance of the seat bottom front sensor.

24. The seat occupant sensor system of claim 21 wherein:

the at least one seat occupant sensor includes a seat bottom left sensor disposed within a left portion of a seat bottom of the seat and a seat bottom right sensor disposed within a right portion of the seat bottom, wherein the controller determines whether the seat occupant is sitting left or right on the seat bottom as a function of the capacitances of the seat bottom left and right sensors.

25. The seat occupant sensor system of claim 21 wherein:

the at least one seat occupant sensor includes at least one seat bottom sensor disposed within a seat bottom of the seat, wherein the controller determines the weight of the seat occupant as a function of the capacitance of the at least one seat bottom sensor.

26. The seat occupant system of claim 21 wherein:

the controller is operable to reverse the polarity between the first, second, and third flexible conductor plates such that the first conductor plate is electrically grounded, wherein the controller monitors the capacitance of the at least one seat occupant sensor after reversing the polarity to determine whether the seat occupant is an animate or inanimate object.

* * * * *